United States Patent
Mitra

(10) Patent No.: US 8,370,411 B2
(45) Date of Patent: Feb. 5, 2013

(54) GENERATING UNIQUE RANDOM NUMBERS FOR MULTIPLE INSTANTIATIONS

(75) Inventor: Swapnajit Mitra, Santa Clara, CA (US)

(73) Assignee: PLX Technology, Inc., Sunnyvale, CA (US)

(*) Notice: Subject to any disclaimer, the term of this patent is extended or adjusted under 35 U.S.C. 154(b) by 512 days.

(21) Appl. No.: 12/723,403

(22) Filed: Mar. 12, 2010

(65) Prior Publication Data

US 2011/0225223 A1     Sep. 15, 2011

(51) Int. Cl.
G06F 1/02      (2006.01)
G06F 7/58      (2006.01)
(52) U.S. Cl. ........................................ 708/250; 708/254
(58) Field of Classification Search ........... 708/250–256
See application file for complete search history.

(56) References Cited

U.S. PATENT DOCUMENTS

| | | | |
|---|---|---|---|
| 5,778,069 A * | 7/1998 | Thomlinson et al. | 380/262 |
| 7,894,602 B2 * | 2/2011 | Mueller et al. | 380/46 |
| 2010/0070549 A1 * | 3/2010 | Nagaraj | 708/254 |

OTHER PUBLICATIONS

Accellera Organization, Inc., "SystemVerilog 3.1a Language Reference Manual", 2004, pp. 128-165, 261-278.*
N. Sklavos et al., "Random number generator architecture and VLSI implementation", Proceedings of ISCAS '02, vol. IV. May 2002, pp. 854-857.*

\* cited by examiner

*Primary Examiner* — Chat Do
*Assistant Examiner* — Matthew Sandifer
(74) *Attorney, Agent, or Firm* — Beyer Law Group LLP

(57) ABSTRACT

In a first embodiment of the present invention, a method for generating a random number for an instance of a hardware description language definition is provided, the method comprising: generating a unique signature for the instance; applying a message digest generation process on the unique signature to arrive at a message digest having a fixed length; and applying a random number generation process on the message digest.

16 Claims, 6 Drawing Sheets

GENERATING UNIQUE RANDOM NUMBERS FOR MULTIPLE INSTANTIATIONS

BACKGROUND OF THE INVENTION

1. Field of the Invention

The present invention relates generally to computer devices. More specifically, the present invention relates to the generation of unique random numbers for multiple instantiations.

2. Description of the Related Art

Computers utilize random numbers in a variety of different applications. While the term random numbers is commonly used in the computer industry, most of these numbers are actually pseudo-random numbers generated using a random number generation algorithm. These algorithms can automatically create long runs of numbers with good random properties but eventually the sequence repeats (or the memory usage grows without bound). The string of values generated by such algorithms is generally determined by a fixed number called a seed.

Hardware description languages are programming languages used in the creation of electronic circuits, and more specifically digital logic. A hardware description language describes the circuit's operations, design, and organization. Simulations may then be run to verify the proposed circuit's operation. Common hardware description languages include Verilog and Very High Speed Integrated Circuit Hardware Description Language (VHDL).

In Verilog, a hardware module definition may be used to describe the attributes of the proposed hardware module. This definition includes the module's operations, design, and organization.

In order to test the proposed hardware module, simulation software ("simulator") then instantiates the hardware module definition and operates it in a test environment alongside instantiations of other hardware modules and components that would interact with the hardware module in an actual circuit.

In certain situations, the same hardware module definition may be instantiated multiple times in a single simulation. For example, a switch may contain multiple port modules, each port module being structurally identical to one another. A single hardware description language definition of a port module may then be instantiated multiple times, one for each port module to be located in the switch.

Since random number generation in a computer system is performed using random number generation algorithms, if a hardware description language definition contains a call to a random number generation algorithm and an initial seed, a problem occurs if that definition is instantiated multiple times, as each instance of the definition will wind up generating the same "random" numbers. This renders testing useless, as random events in the real world do not occur in such a non-random fashion.

In the past, this problem has been solved by providing a different seed to each instance of a particular hardware description language definition, or by otherwise coordinating between or among the instances to ensure that the random numbers are different. This, however, requires that there be interaction between the instances, either directly or indirectly.

Another possible solution would be to not pass any parameters and to let the simulator generate the random numbers. This, however, results in irreproducible results when logic definition changes.

In some circumstances, however, it is desirable to minimize interactions between components of a circuit, such as where bandwidth is limited or other physical factors influence the desirability of high levels of communications.

SUMMARY OF THE INVENTION

In a first embodiment of the present invention, a method for generating a random number for an instance of a hardware description language definition is provided, the method comprising: generating a unique signature for the instance; applying a message digest generation process on the unique signature to arrive at a message digest having a fixed length; and applying a random number generation process on the message digest.

In a second embodiment of the present invention, a hardware description language simulation module is provided comprising: a unique signature generator configured to generate a unique signature for an instance of a hardware description language definition; a message digest generator configured to apply a message digest generation process on the unique signature to arrive at a message digest having a fixed length; and a random number generator configured to apply a random number generation process on the message digest.

In a third embodiment of the present invention, an apparatus is provided comprising: means for generating a unique signature for the instance; means for applying a message digest generation process on the unique signature to arrive at a message digest having a fixed length; and means for applying a random number generation process on the message digest.

In a fourth embodiment of the present invention, a program storage device readable by a machine tangibly embodying a program of instructions executable by the machine to perform a method for generating a random number for an instance of a hardware description language definition is provided, the method comprising: generating a unique signature for the instance; applying a message digest generation process on the unique signature to arrive at a message digest having a fixed length; and applying a random number generation process on the message digest.

DETAILED DESCRIPTION OF SPECIFIC EMBODIMENTS

Figure 1:
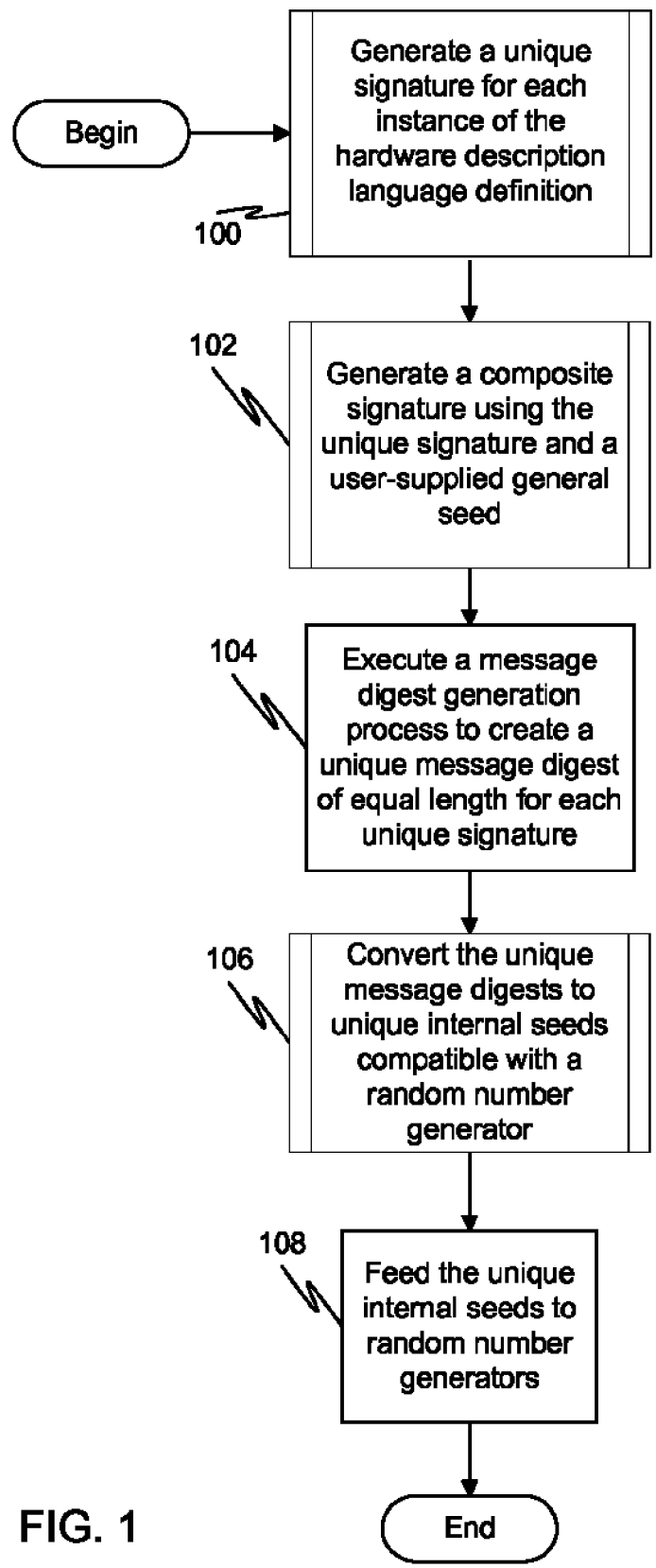
FIG. 1 is a flow diagram illustrating a method for generating random numbers for multiple instances of a hardware description language definition in accordance with an embodiment of the present invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

It should be noted that the term "random number" as used in the present document shall be construed broadly and in line with common usage in the computer software field. Specifically, when describing a random number generated by a computer, it is recognized that the term random number shall include pseudo-random numbers.

It should also be noted that the term "hardware description language" as used in the present document shall be construed broadly to mean any programming language used to describe hardware specifications. This can include traditional hardware description languages such as Verilog that are solely designed to describe hardware specifications, but it can also include other, more generic programming languages that are utilized in such a way as to describe hardware specification. For example, it is possible to use C or C++ to describe hardware specifications. In such an instance, C or C++ would constitute a hardware description language in the context of the present invention.

In an embodiment of the present invention, a process is provided that generates controlled and unique random numbers within identical, but multiply-instantiated hardware module descriptions without any interfacing from any other module description. In other words, assuming A and B are instances of the same hardware module Z, a unique random number is generated for A or B without any additional parameter being passed to Z to generate this number uniquely for each instance of Z.

In one embodiment of the present invention, a general seed, applicable to all instances of Z, can be used to control the generation of random numbers. This is an optional feature that allows the generated numbers to be both unique for each instance of Z but also that each instance of Z generates the same set of random numbers each time, ensuring repeatability. Repeatability can be important when attempting to pinpoint issues uncovered during test runs using the simulator.

Figure 2:
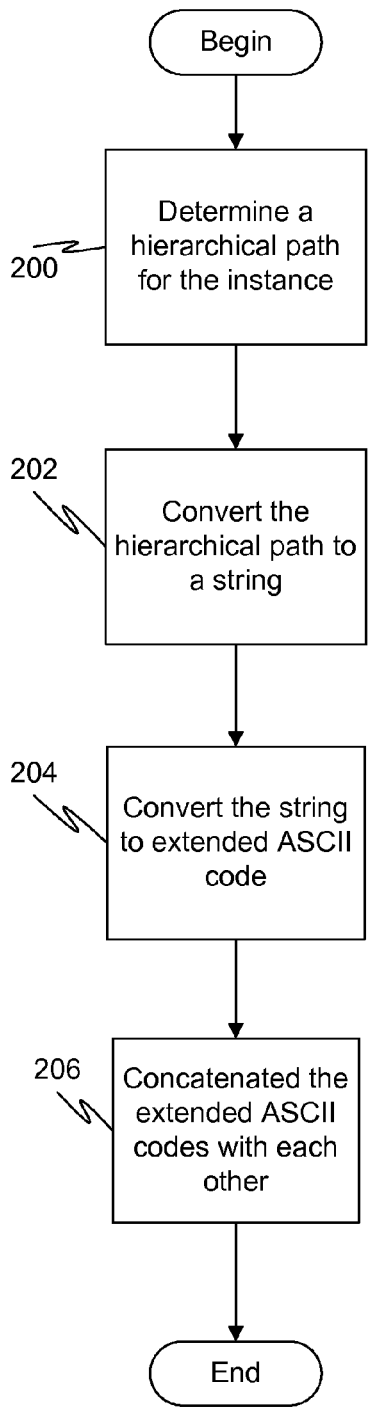
FIG. 2 is a flow diagram illustrating a method for generating a unique signature for an instance of a hardware description language definition in accordance with an embodiment of the present invention.

FIG. 1 is a flow diagram illustrating a method for generating random numbers for multiple instances of a hardware description language definition in accordance with an embodiment of the present invention. At 100, a unique signature is generated for each instance of the hardware description language definition. There may be multiple different ways to accomplish this step. FIG. 2 is one example of how to generate a unique signature.

Figure 3:
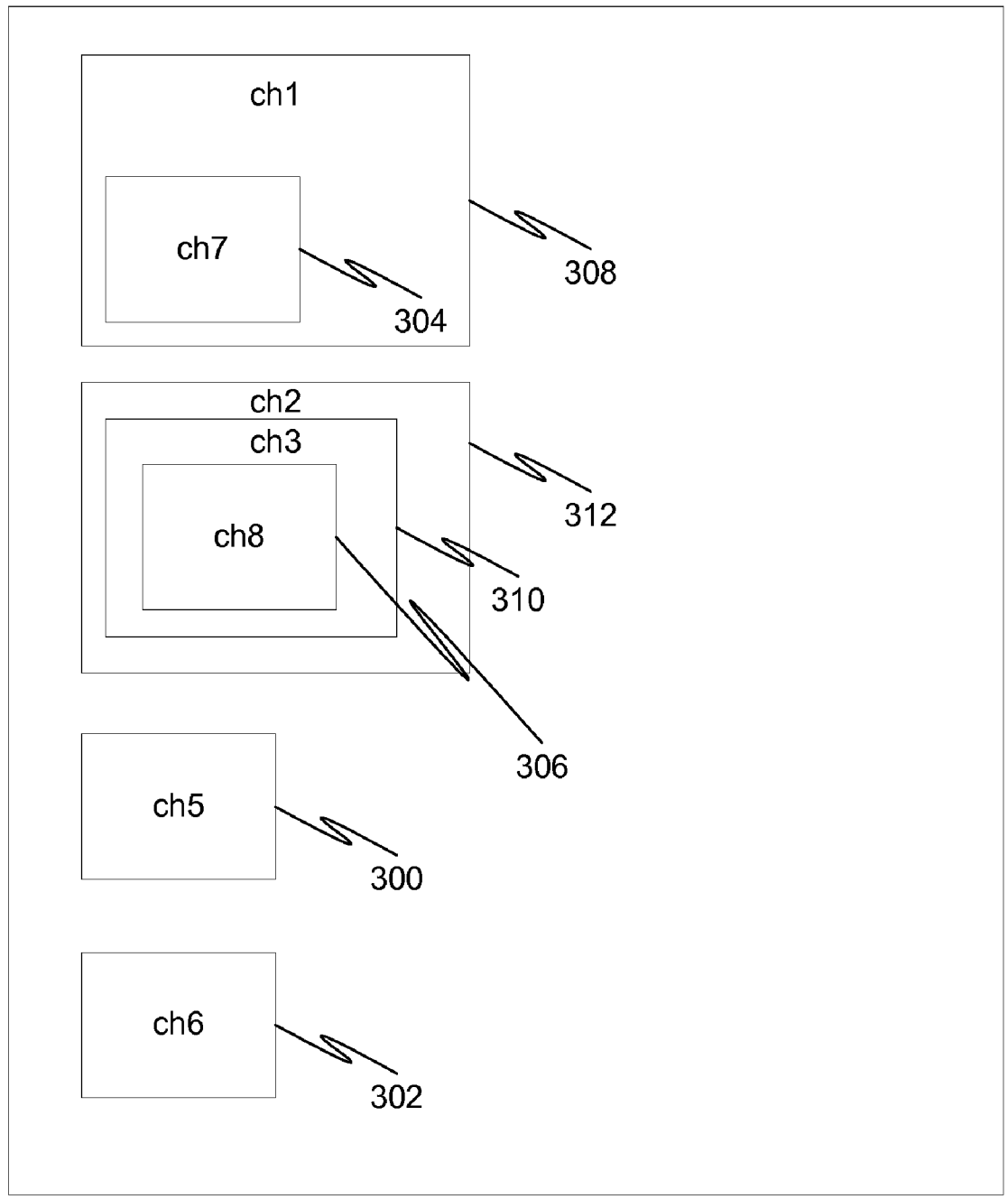
FIG. 3 is a graphical depiction of how an instance may either be called outside of any other instance, or may be called from within an instance of another definition, in accordance with an embodiment of the present invention.

FIG. 2 is a flow diagram illustrating a method for generating a unique signature for an instance of a hardware description language definition in accordance with an embodiment of the present invention. One of ordinary skill in the art will recognize that this is merely an example, and that there may be other ways of generating a composite signature in keeping with the spirit of the invention. Here, it is first recognized that the instances may be organized hierarchically. Meaning, an instance may either be called outside of any other instance, or may be called from within an instance of another definition. FIG. 3 depicts this graphically. Each of ch5 300, ch6 302, ch7 304, and ch8 306 may be a different instance of a single hardware description language definition Z. Ch5 300 and ch6 302 are called outside of any other instance, but ch7 304 may be called within instance ch1 308, which is an instance of hardware description language definition Y. Instance ch8 306 may be called within instance ch3 310, which is an instance of hardware description language definition X, which itself is called within instance ch2 312, which is an instance of hardware description language W.

Thus, it can be recognized that an instance may be uniquely identified by its location within a hierarchy and its name.

Referring back to FIG. 2, at 200, a hierarchical path is determined for the instance. For example, in the example provided in FIG. 3, the hierarchical path for ch7 would be "top→ch1→ch7" while the hierarchical path for ch8 would be "top→ch2→ch3→ch8". At 202, the hierarchical path is converted to a string. For example, the string generated for ch7 might be "top/ch1/ch7." At 204, the string is converted to extended American Standard Code for Information Interchange (ASCII) code. In extended ASCII code, each character corresponds to a numeric code. For example, "t" corresponds to "116" and "o" corresponds to "111". It should be noted that these numeric codes are expressed here in decimal form, whereas it is possible that they will be stored in the system as hexadecimal or binary numbers. Nevertheless, the effect will be the same—each character is converted to a numeric code uniquely corresponding to that character.

At 206, the extended ASCII codes are then concatenated with each other. In one embodiment of the present invention, each character would take 8 bits. Thus, this results in an 8n bit signature, where n is equal to the number of characters in the string generated from the path of the instance. Thus, the signatures will likely be of differing lengths. This will be accounted for later in the process.

Figure 4:
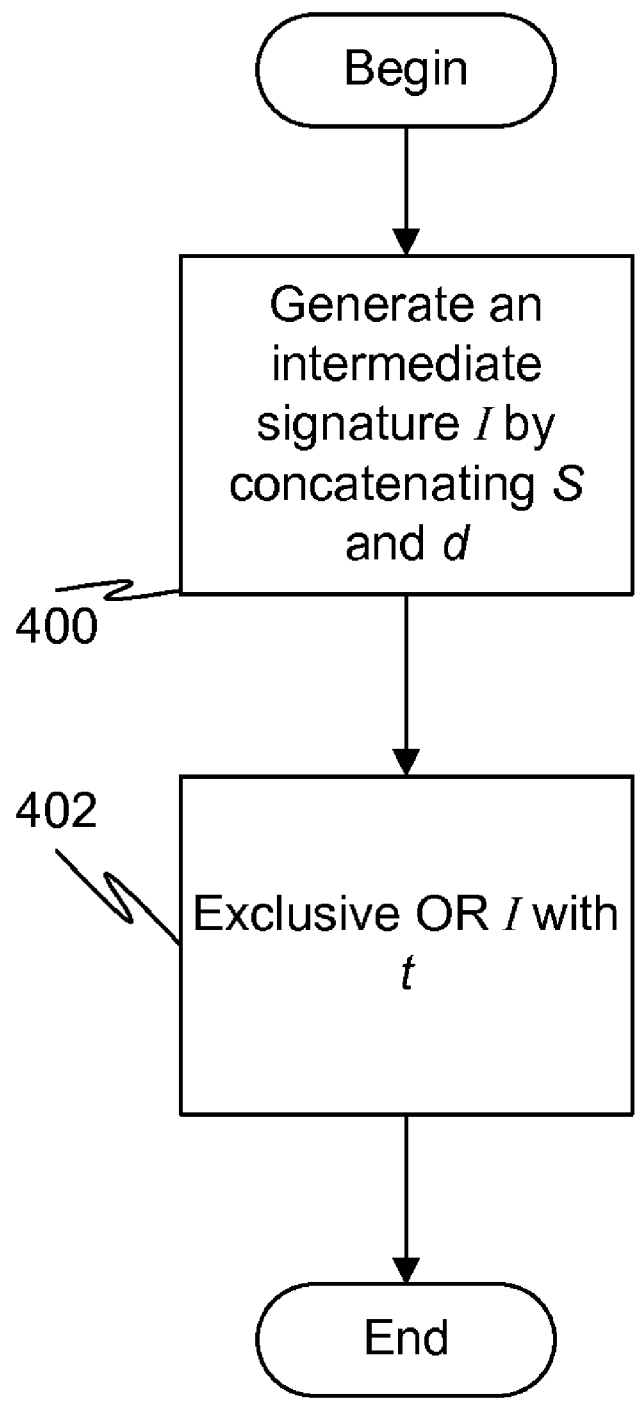
FIG. 4 is a flow diagram illustrating an example of how a composite signature can be generated using a unique signature and a user-supplied seed in accordance with an embodiment of the present invention.

Referring back to FIG. 1, at 102, a composite signature can be generated using the unique signature from step 100 and a user-supplied general seed. FIG. 4 is a flow diagram illustrating an example of how a composite signature can be generated using a unique signature and a user-supplied seed in accordance with an embodiment of the present invention. One of ordinary skill in the art will recognize that this is merely an example, and that there may be other ways of generating a composite signature in keeping with the spirit of the invention.

The process of generating composite signatures (S) in line with this example involves taking a module specific input signature (S) from step 100 and incorporating the current simulation time (t) and optionally the current user-specified seed d. In other words, S'(Z)=g(S, t, d). In one embodiment of the present invention, d is a 128-bit integer (long long integer) and t is a 64-bit integer (long integer). At 400, an intermediate signature I is generating by concatenating S and d. If d is not specified, then I can simply be set as equal to S. At 402, I is exclusive-ORed with t.

At this point, however, the composite signature is still of a variable length. As such, referring back to FIG. 1, at 104 a message digest generation process is executed to create a unique message digest of equal length for each unique signature. Essentially, this process is utilized to equalize the lengths of the signatures while still maintaining their uniqueness. There may be multiple ways to accomplish this goal. In one embodiment, the Message Digest Algorithm 5 (MD5) can be used. MD5 is a widely used cryptographic hash function with a 128-bit hash value (or multiples thereof, however in the present embodiment the 128-bit implementation is utilized). MD5 processes a variable-length message into a fixed-length output of 128 bits. The input message is broken up into chunks of 512-bit blocks (sixteen 32-bit little endian integers); the message is padded so that its length is divisible by 512. The padding works as follows: first a single bit, 1, is appended to the end of the message. This is followed by as many zeros as are required to bring the length of the message up to 64 bits fewer than a multiple of 512. The remaining bits are filled up with a 64-bit integer representing the length of the original message, in bits.

The main MD5 algorithm operates on a 128-bit state, divided into four 32-bit words, denoted A, B, C and D. These are initialized to certain fixed constants. The main algorithm then operates on each 512-bit message block in turn, each block modifying the state. The processing of a message block consists of four similar stages, called rounds, wherein each round is composed of 16 similar operations based on a non-linear function F, modular addition, and left rotation.

It should be noted that in one embodiment of the present invention the desired fixed length of the unique signatures is 32 bits, to serve as input to 32 bit random number generator. If step 104 results in a digest length different than 32 bits (as in MD5's 128 bit length), then it may be necessary to convert the digests. At 106, therefore, the unique message digests may be converted to unique internal seeds compatible with a random number generator. This may be accomplished by, for example, performing an XOR operation between the lower and the upper 32 bits of the 128 bit MD5 message digests. Of course, one of ordinary skill in the art will recognize that different techniques can be utilized other than using an XOR operation, and that the parameters of the operations may differ (e.g., if the random number generator takes 64 bit input, an XOR can be performed between the lower and upper 64 bits of the 128 bit MD5 message digests.

Figure 5:
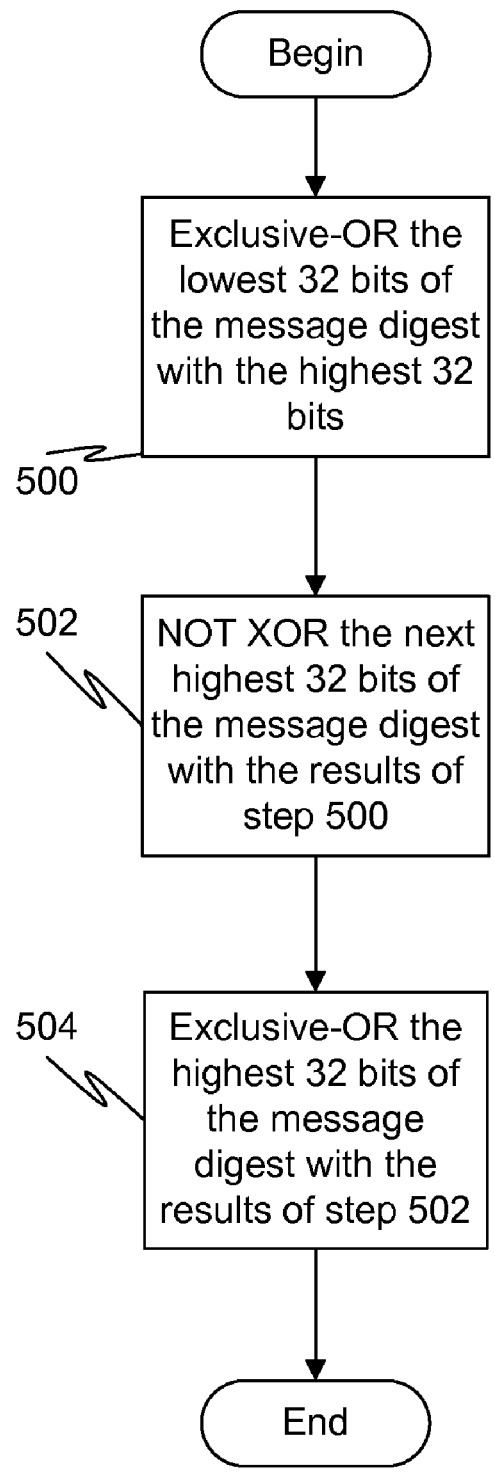
FIG. 5 is a flow diagram illustrating another example of a method for converting a unique message digest to a unique internal seed compatible with a random number generator in accordance with an embodiment of the present invention.

FIG. 5 is a flow diagram illustrating another example of a method for converting a unique message digest to a unique internal seed compatible with a random number generator in accordance with an embodiment of the present invention. Here, at 500, the lowest 32 bits of the message digest is exclusive-ORed with the highest 32 bits of the message digest. At 502, the next highest 32 bits of the message digest are NOT XORed with the result of step 500. At 504 the highest 32 bits of the message digest are exclusive-ORed with the result of step 502.

Referring back to FIG. 1, at 108, the output of step 106 is fed to a random number generator, which then will generate a unique random number for the instance that is repeatable if the same initial seed is provided at step 102. This random number then would have been generated without any sort of interfacing with any other module description.

Figure 6:
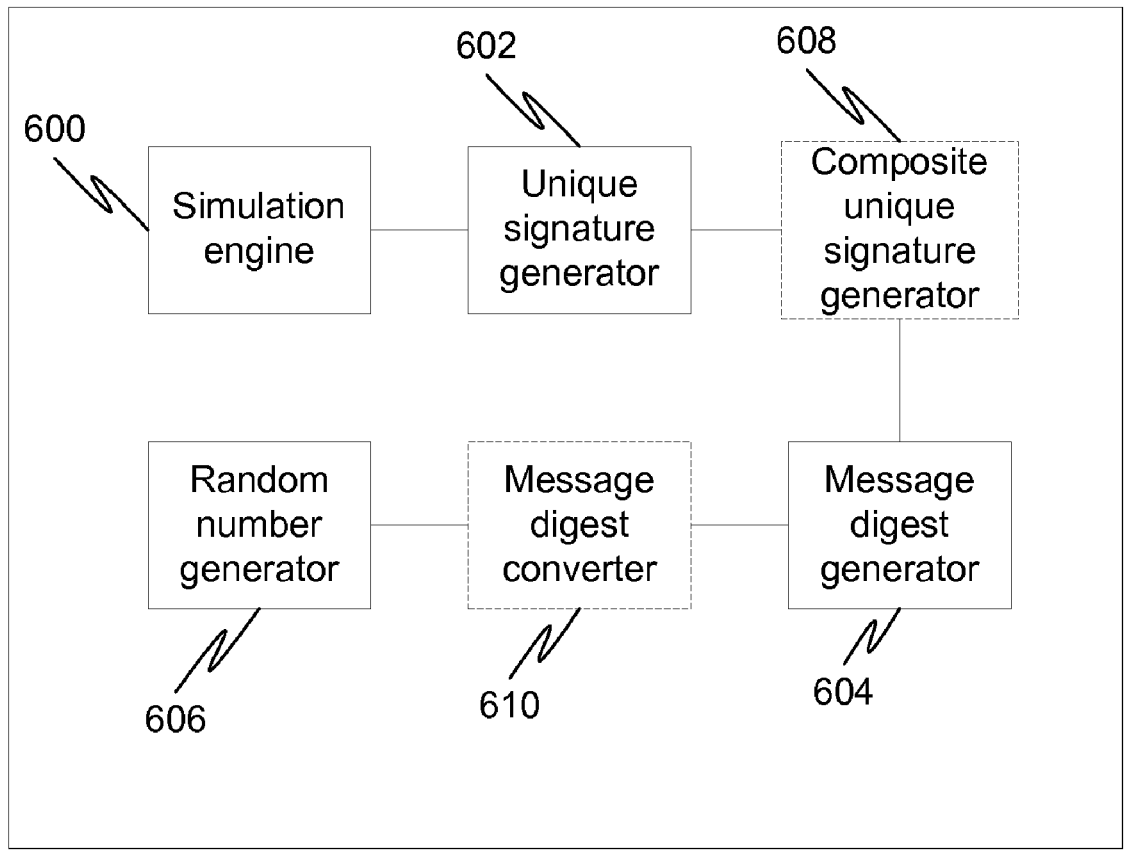
FIG. 6 is a block diagram illustrating a hardware description language simulation module in accordance with an embodiment of the present invention.

FIG. 6 is a block diagram illustrating a hardware description language simulation module in accordance with an embodiment of the present invention. A simulation engine 600 may be provided to drive the actual simulation actions, including generating instances of hardware description language definitions. A unique signature generator 602 is the configured to generate a unique signature for an instance of a hardware description language definition. The unique signature generator 602 can be configured to perform any of the actions described above with respect to step 100 of FIG. 1 and any of the steps of FIG. 2.

A message digest generator 604 is then configured to apply a message digest generation process on the unique signature to arrive at a message digest having a fixed length. The message digest generator 604 can be configured to perform any of the actions described above with respect to step 104 of FIG. 1.

A random number generator 606 is then configured to apply a random number generation process on the message digest. The random number generator 606 can be configured to perform any of the actions described above with respect to step 108 of FIG. 1.

Optionally, a composite unique signature generator 608 may be utilized between the unique signature generator 602 and the message digest generator 604. This may act to generate a composite unique signature based upon the generated unique signature and the current time. Optionally this composite unique signature can also be based on a user-specified seed. The composite unique signature generator 608 can be configured to perform any of the actions described above with respect to step 102 of FIG. 1 and any of the steps of FIG. 4.

Additionally, a message digest converter 610 may be utilized between the message digest generator 604 and the random number generator 606 to convert the unique message digest to a unique internal seed compatible with the random number generator. The message digest converter 610 can be configured to perform any of the actions described above with respect to step 106 of FIG. 1 and any of the steps of FIG. 5.

It should also be noted that the hardware description language simulation module may be embodied in hardware or software, or any combination thereof. In a software embodiment, one or more of the components are designed as programmable computer instructions executable by a machine, such as a computer processor, the instructions stored in a computer readable medium.

While the invention has been particularly shown and described with reference to specific embodiments thereof, it will be understood by those skilled in the art that changes in the form and details of the disclosed embodiments may be made without departing from the spirit or scope of the invention. In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A method for generating a random number for an instance of a hardware description language definition, the method comprising executing computer instructions stored on a memory device, which further comprises:
   generating, by the processor, a unique signature for the instance;
   applying, by the processor, a message digest generation process on the unique signature to arrive at a message digest having a fixed length; and applying, by the processor, a random number generation
process on the message digest;
wherein the generating includes:
  determining a path for the instance, and
  converting the path to a unique signature; and
wherein the converting the path includes:
  converting a path name corresponding to each node in
    the path to a numerical code, and
  concatenating the numerical codes corresponding to
    each node in the path together to form a unique signature.

2. The method of claim 1, wherein the numerical code is extended American Standard Code for Information Interchange (ASCII) code.

3. The method of claim 1, further comprising:
generating a composite unique signature based upon the generated unique signature and the current time.

4. The method of claim 3, wherein the generated composite unique signature is also based upon a user-specified seed.

5. The method of claim 4, wherein the generating a composite unique signature includes concatenating the generated unique signature and the user-specified seed, and exclusive-ORing the result with the current time.

6. The method of claim 3, wherein the applying a message digest generation process utilizes the composite unique signature.

7. The method of claim 1, wherein the message digest generation process is a Message Digest Algorithm, 5 (MD5) process.

8. The method of claim 1, further comprising reducing the length of the message digest prior to applying a random number generation process on the message digest.

9. The method of claim 8, wherein the reducing the length includes performing an XOR operation between the lower and the upper 32 bits of the message digest and using the result as a reduced message digest.

10. The method of claim 8, wherein the reducing the length includes
  (a) exclusive ORing the lowest 32 bits and the upper 32 bits of the message digest;
  (b) NOT XORing the next highest 32 bits of the message digest with the result from (a); and
  (c) exclusive ORing the highest 32 bits of the message digest with the result from (b).

11. A hardware description language simulation module comprising computer instructions stored on a memory device and executable by a computer processor, which, when executed, provide:
  a unique signature generator to generate, by the processor, a unique signature for an instance of a hardware description language definition, the unique signal generator configured to:
    determine a path for the instance, and
    convert the path to a unique signature; and
  wherein the convert the path includes:
    convert a path name corresponding to each node in the path to a numerical code, and
    concatenate the numerical codes corresponding to each node in the path together to form a unique signature;
  a message digest generator configured to apply, by the processor, a message digest generation process on the unique signature to arrive at a message digest having a fixed length; and
  a random number generator configured to apply, by the processor, a random number generation process on the message digest.

12. The hardware description language simulation module of claim 11, wherein the hardware description language simulation module is called from within the instance of the hardware description language definition.

13. The hardware description language simulation module of claim 11, wherein each calling of the hardware description language simulation module results in the generation of a random number without interaction with any other instance of the hardware description language definition.

14. An apparatus for generating a random number for an instance of a hardware description language definition, comprising:
  means for generating a unique signature for the instance wherein the means for generating a unique signature for the instance includes means for:
    determining a path for the instance, and
    converting the path to a unique signature; and
  wherein the converting the path includes:
    converting a path name corresponding to each node in the path to a numerical code, and
    concatenating the numerical codes corresponding to each node in the path together to form a unique signature;
  means for applying a message digest generation process on the unique signature to arrive at a message digest having a fixed length; and
  means for applying a random number generation process on the message digest.

15. The apparatus of claim 14, further comprising means for reducing the fixed length of the message digest prior to passing the message digest to the means for applying a random number generation process.

16. A non-transitory program storage device readable by a machine tangibly embodying a program of instructions executable by the machine to perform a method for generating a random number for an instance of a hardware description language definition, the method comprising executing computer instructions stored on a memory device, which further comprises:
  generating, by the processor, a unique signature for the instance;
  applying, by the processor, a message digest generation process on the unique signature to arrive at a message digest having a fixed length; and
  applying, by the processor, a random number generation process on the message digest;
  wherein the generating includes:
    determining a path for the instance, and
    converting the path to a unique signature; and
  wherein the converting the path includes:
    converting a path name corresponding to each node in the path to a numerical code, and
    concatenating the numerical codes corresponding to each node in the path together to form a unique signature.

* * * * *